United States Patent [19]

Childers

[11] Patent Number: 4,509,142
[45] Date of Patent: Apr. 2, 1985

[54] SEMICONDUCTOR MEMORY DEVICE WITH PIPELINE ACCESS

[75] Inventor: Jimmie D. Childers, Missouri City, Tex.

[73] Assignee: Texas Instruments Incorporated, Dallas, Tex.

[21] Appl. No.: 449,959

[22] Filed: Dec. 15, 1982

[51] Int. Cl.³ .............................................. G06F 13/00
[52] U.S. Cl. .................................................. 364/900
[58] Field of Search ... 364/200 MS File, 900 MS File

[56] References Cited

U.S. PATENT DOCUMENTS 4,156,905 5/1979 Fassbender ........................ 364/900

Primary Examiner—Raulfe B. Zache

Attorney, Agent, or Firm—John G. Graham

[57] ABSTRACT

A semiconductor memory device contains an on-chip self-incrementing counter which may be loaded from address input terminals, so that the memory cell array may be accessed using either an incoming address or the last address incremented by one. Also, the incremented last address is saved in a latch. A comparator receives the present address and incremented last address, and if these match a data output is available immediately. After a read cycle, the array is always accessed using the incremented last address, so when another fetch is initiated from the CPU, if it is for the next sequential address, the data is already available in a data ouput latch and the apparent access time is much less than that of the memory array.

15 Claims, 6 Drawing Figures

SEMICONDUCTOR MEMORY DEVICE WITH PIPELINE ACCESS

BACKGROUND OF THE INVENTION

This invention relates to semiconductor memory devices and more particularly to an improved MOS random access dynamic read/write memory having high speed pipe-line access.

One of the most widely used memory devices for computers is the MOS dynamic RAM of the type illustrated in U.S. Pat. No. 4,239,993 issued to McAlexander, White and Rao, assigned to Texas Instruments. As presently commercially available in the 64K-bit size, these devices have read access times of 150 nsec or less. Generally, a memory access time is selected to avoid wait conditions for the CPU. When higher speeds are needed, static RAM devices are used, having read access times of 55 nsec or below, but these are much more expensive, and consume more power.

In operation of a CPU, a statistical analysis shows that the main program memory is most often accessed with the next sequential address. Branches, interrupts, and the like present non-sequential addresses, but these occur in a minor percentage of the program fetches. Systems have been developed which are based on the theory that the next address is always accessed, and so processors are constructed which automatically fetch the next address; this data is available if needed, and is discarded if not.

It is the principal object of this invention to provide an improved high speed random access memory, particularly for a memory operating on a pre-fetch theory. Another object is to provide a semiconductor memory device which can implement high speed pipe-lined access with a minimum of off-chip circuitry. A further object is to provide an improved method of pipeline or sequential-address accessing of a memory device in a digital processor system.

SUMMARY OF THE INVENTION

In accordance with one embodiment of the invention, a semiconductor memory device contains an on-chip self-incrementing counter which may be loaded from address input terminals, so that the memory cell array may be accessed using either an incoming address or the last address incremented by one. Also, the incremented last address is saved in a latch. A comparator receives the present address and incremented last address, and if these match a data output is available immediately. After a read cycle, the array is always accessed using the incremented last address, so when another fetch is initiated from the CPU, if it is for the next sequential address, the data is already available in a data output latch and the apparent access time is much less than that of the memory array.

BRIEF DESCRIPTION OF THE DRAWINGS

The novel features believed characteristic of the invention are set forth in the appended claims. The invention itself, however, as well as other features and advantages thereof, will be best understood by reference to detailed description which follows, read in conjunction with the accompanying drawings, wherein:

DETAILED DESCRIPTION OF SPECIFIC EMBODIMENT

Figure 1:
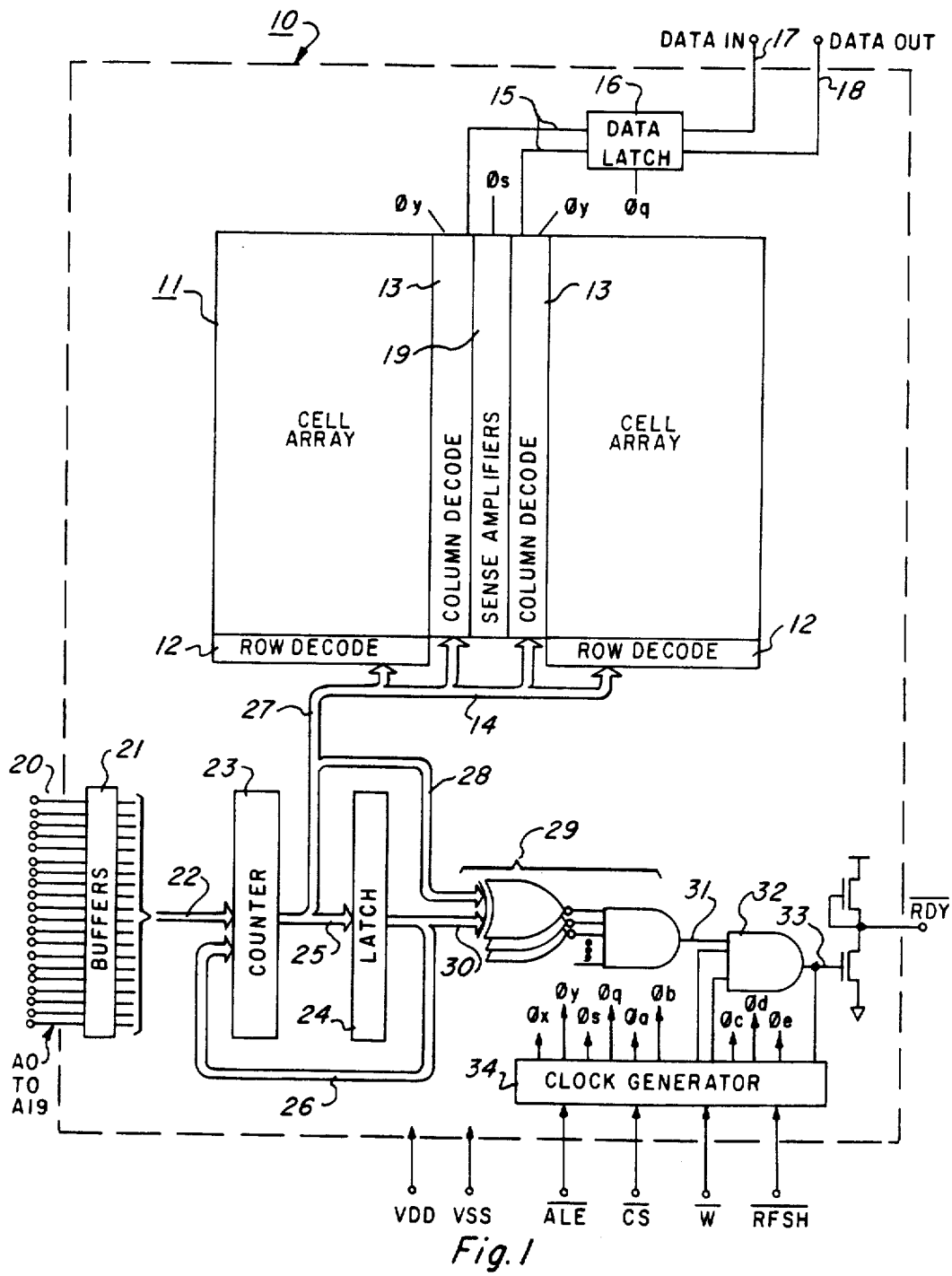
FIG. 1 is an electrical schematic diagram in block form of a semiconductor memory device employing features of the invention in a microcomputer system.

Referring to FIG. 1, a memory device 10 is illustrated which is constructed according to the invention. The device 10 is a VLSI chip containing an array 11 of one-transistor dynamic memory cells of the type shown in U.S. Pat. No. 4,239,993 issued to McAlexander, White & Rao, assigned to Texas Instruments. In this embodiment, the array 11 is of the "1-Megabit" size, containing $2^{20}$ or 1,048,576 cells. The cell array generally contains 1024 rows and 1024 columns of cells, although it would be partitioned in smaller blocks so the number of cells on a given column line is small enough to provide an acceptable ratio of storage capacitance to bit line capacitance. Row and column decoders 12 and 13 receive a 20-bit address on lines 14 to select one cell, or alternatively the array may produce a "x4" or "x8" output instead of single-bit in which case the address is correspondingly less than 20-bit. A data input/output circuit of conventional form is connected to the array 10 via the column decode by lines 15 and includes an I/O latch 16 connected to terminals 17 and 18; although shown with separate input and output terminals, a single I/O terminal may be used, and of course a x4 or x8 device woudl have four or eight data terminals. A read/write R/$\overline{\text{W}}$ or $\overline{\text{W}}$ control terminal selects read or write operations as is conventional.

The address input to the device includes twenty terminals 20 for the A0-A19 address bits, and these terminals are coupled to twenty address buffers 21 as disclosed in U.S. Pat. No. 4,288,706 for example. The output of the buffers 21 is connected by lines 22 to (and through) a 20-bit counter circuit 23 which is of the type shown in U.S. Pat. Nos. 3,991,305 or 4,027,618, for example. This circuit 23 functions to load the 20-bit address from lines 22 into its twenty stages when a control $\overline{\text{ALE}}$ occurs, and also functions to increment its contents by one after a read access. The contents of the counter 23 may be loaded into a 20-bit latch 24 by lines 25 whereby the incremented count may be saved for later loading back into the counter 23 from latch 24 by lines 26. The output of the counter 23 is also connected by lines 27 to the decoder input 14, so the address used to access the array 11 when $\overline{\text{ALE}}$ is activated is the input 20 which is also the not-yet incremented contents of the counter 23. If the new address loaded from the input pins 20 at $\overline{\text{ALE}}$ matches the incremented previous count saved in latch 24, the data in the latch 16 goes to output 18 as will be explained, and a fetch from the array 11 is done using the incremented new address and this data saved in the latch 16. A write operation is usually non-sequential so the address of the prior read may be fed back by lines 26 from latch 24 to counter 23. The counter 23 also functions to increment from a starting address loaded from pins 20 for refresh operations, according to U.S. Pat. Nos. 4,027,618, 4,344,157 and 4,333,167, assigned to Texas Instruments; to initiate a refresh operation a $\overline{\text{RFSH}}$ terminal is brought to active-low.

The output of the counter 23 is connected to one input 28 of a 20-bit exclusive NOR circuit 29 functioning as a logical comparator. The other input 30 is from the output of the latch 24. Thus, the incremented last address saved in latch 24 can be compared with the incoming address (which is the contents of the counter 23) to produce an output 31 which indicates that the two addresses match. This output is connected to one input of a logic circuit 32 which also receives the chip select $\overline{\text{CS}}$ and address latch enable $\overline{\text{ALE}}$ inputs. The circuit 32 produces an output 33 to a ready $\overline{\text{RDY}}$ terminal 34.

According to the invention, for read operations the device of FIG. 1 automatically compares (by comparator 29) the previous fetch address (incremented by one) and the currently requested address. If the two compare, then the ready line $\overline{\text{RDY}}$ is activated, and data is available at the output 18 earlier because this fetch from the array 11 has already been completed after the previous fetch. Only when a new non-sequential address is introduced does the entire read access have to begin at $\overline{\text{ALE}}$.

Figure 2:
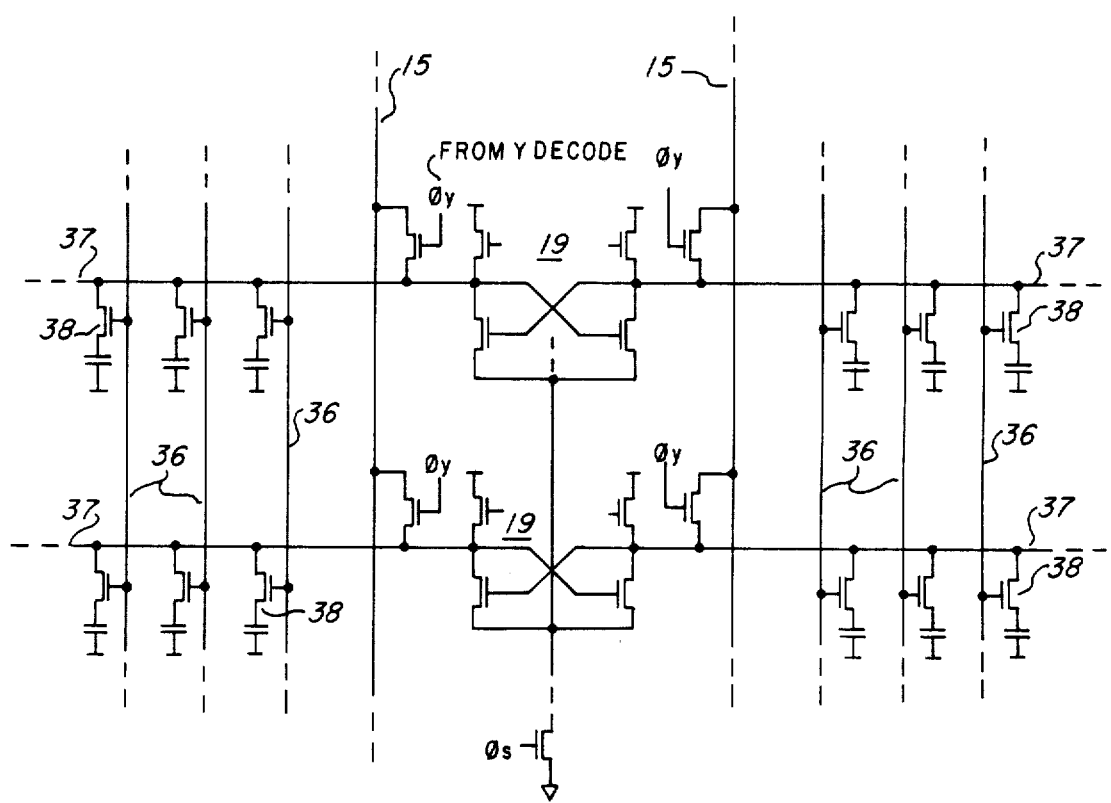
FIG. 2 is a detailed electrical diagram of a representative memory array used in the system of FIG. 1.

Referring to FIG. 2, a typical circuit representative of the RAM array 11 is illustrated. The array contains row address lines 36 which are the outputs of the row address decoders 12, and column (or "bit") lines 37 which are connected to inputs of the sense amplifiers 19. A one-transistor dynamic cell 38 is at the intersection of each row and column line. Rows of dummy cells are included as is the standard practice. Each sense amplifier 19 is a cross-coupled latch which operates when a clock $\phi$s occurs, grounding a common node of these bistable latches. Load and precharge devices are used as in U.S. Pat. Nos. 4,071,801 or 4,239,993. One selected row line 36 goes high when a clock $\phi$x goes high after $\overline{\text{ALE}}$, and $\phi$s goes high after a delay. Then, for read, the selected column is coupled to latch 16 via Y decode 13 and lines 15 when a clock $\phi$y goes high, but the output from latch 16 to pin 18 does not occur until a clock $\phi$q. The read access time for the array 11 itself is the time needed from $\phi$x when an address is accepted from lines 14 into the decoders 12 and 13 until valid data is available in latch 16.

Figure 3:
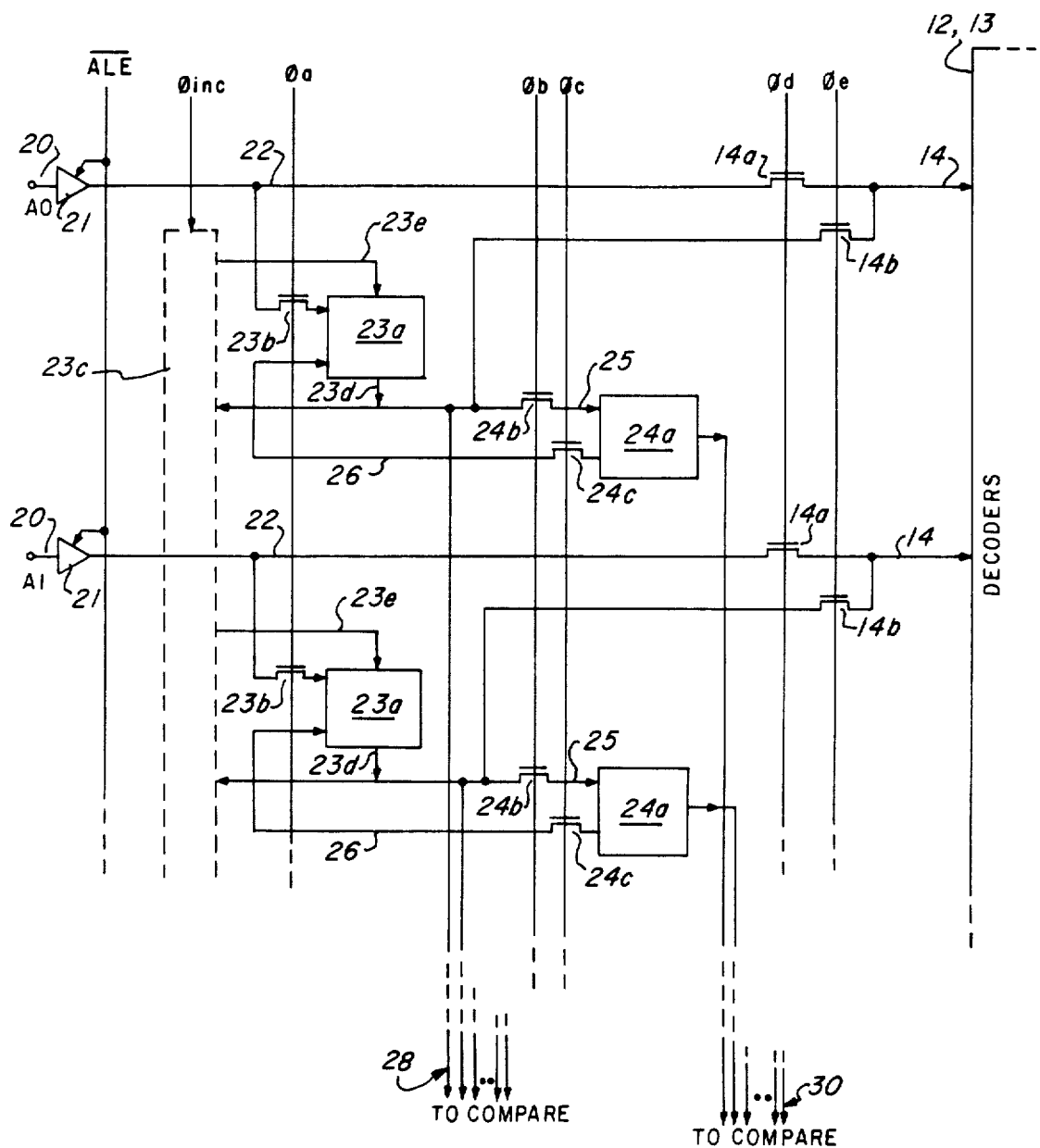
FIG. 3 is a detailed electrical diagram of the addressing circuitry of FIG. 1.

Referring to FIG. 3, the addressing circuit of the device of FIG. 1 is shown in more detail. The counter 23 consists of twenty identical stages 23a, each of which is a pair of dynamic inverters with clocked coupling and feed back transistors. One input to the counter stages 23a is by transistors 23b which have a clock $\phi$a applied to the gates; this clock is derived from $\overline{\text{ALE}}$, so whenever $\overline{\text{ALE}}$ occurs and $\overline{\text{W}}$ is high the address on lines 22 is loaded into the counter. The increment function is accomplished by a feedback circuit 23c of conventional form which toggles the LSB when $\phi$inc occurs after $\overline{\text{ALE}}$ goes high for a read access or refresh, and also toggles each ascending bit if all prior bits are 1. For this purpose, the logic circuit 23c receives an output 23d from each bit, and has an input 23e to each bit. The latch 24 likewise consists of twenty stages 24a which contain two dynamic inverters with clocked transfers. These stages 24a are loaded from the outputs 23d of the counter via transistors 24b controlled by clock $\phi$b, and the contents of stages 24a can be loaded into counter stages 23a by transistors 24c controlled by clock $\phi$c. An output of each stage 24a is connected to the comparator 29 by lines 30, and inputs 22 are also connected to comparator 29 by lines 28. The input address on lines 22, or the outputs of the counter stages 23a after increment, is applied to the inputs 14 of the decoders by transistors 14a or 14b, respectively, by either clock $\phi$d or clock $\phi$e, depending upon whether a match occurs, i.e., whether compare output 33 occurs for read.

Figure 4:
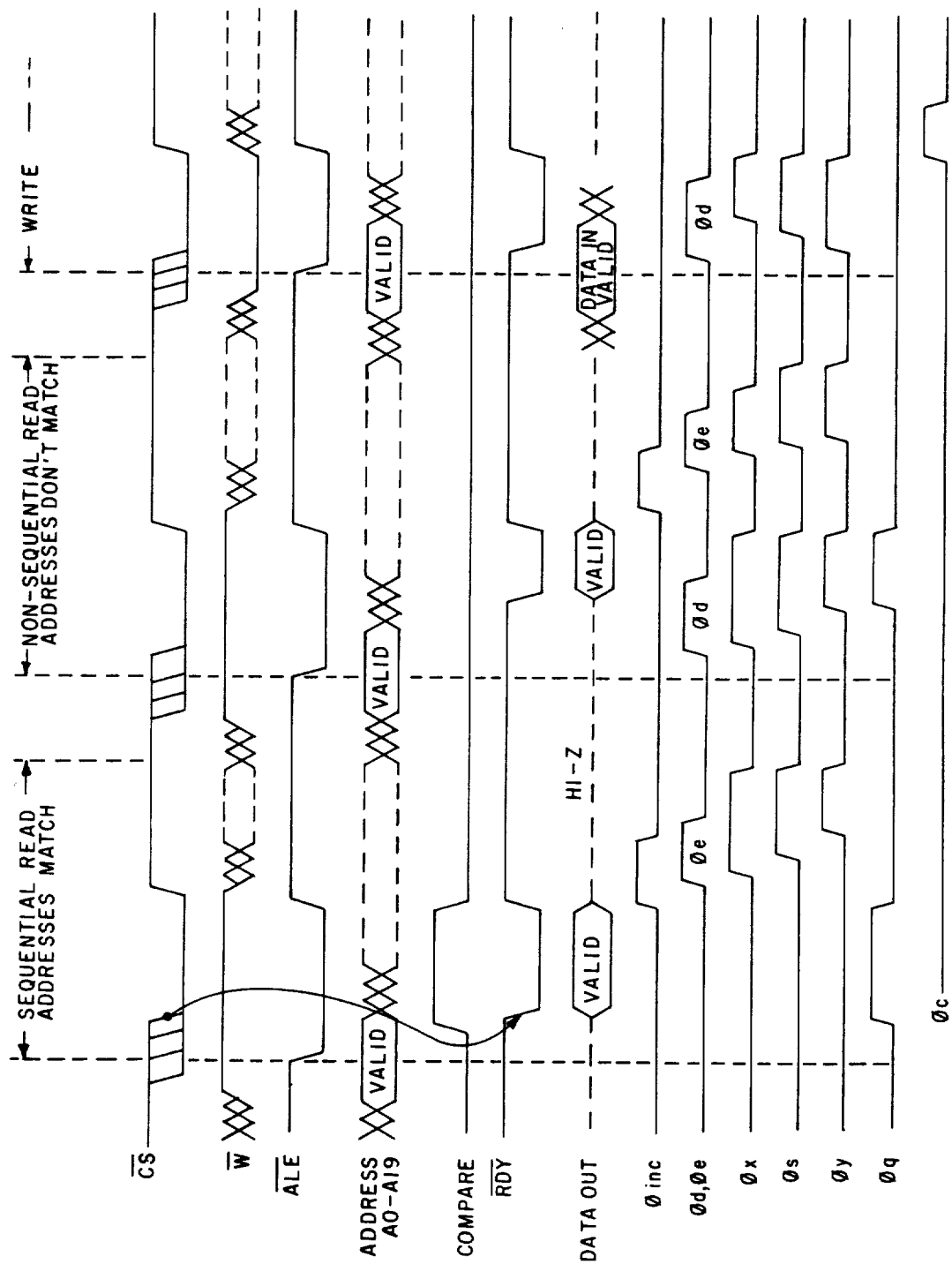
FIG. 4 is a graphic representation of voltage or event vs. time in operation of the device of FIGS. 1-3.

Referring to the timing diagram of FIG. 4, in a read operation when the address latch enable command $\overline{\text{ALE}}$ goes to active-low, an address on pins 20 must be stable. This input address is loaded into counter 23 by lines 22 upon occurance of $\phi$a; a compare operation occurs in comparator 29 and circuit 32 at the time illustrated, so if the incoming address and the address stored in the latch 24 (last address incremented by one) match, the data in the latch 16 is placed on the output 18 at the time $\phi$q if the chip has been selected by $\overline{\text{CS}}$. If no match, the time for an array access including $\phi$d, $\phi$x, $\phi$s and $\phi$y must be interposed. In either event, an array access is performed after the data output, so if the next read is to a sequential address the data is already available.

Figure 5:
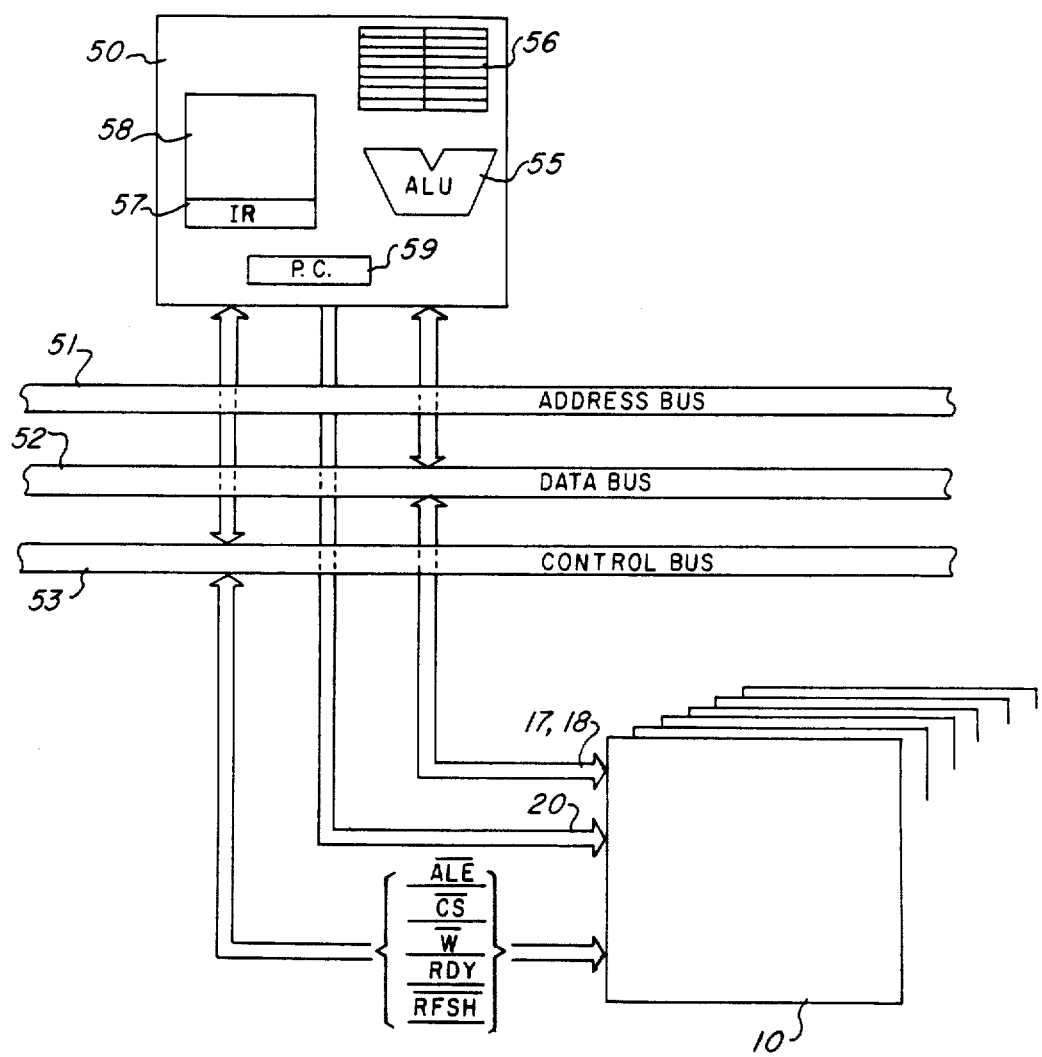
FIG. 5 is a block diagram of a processor system using the device of FIG. 1.

Referring to FIG. 5, a microprocessor system is shown which utilizes the device of FIGS. 1-3. The memory chip 10 has its address terminals 20 conected to a microprocessor 50 by an address bus 51, and the data terminals 17 and 18 are coupled to the microprocessor 50 by a data bus 52 and conventional data latches or the like if the control signals from the microprocessor 50 (usually DEN-, MEN-, etc.) require it. Note that if the device 10 is a 1-Megabit "x 1" as shown in FIG. 1, then sixteen of the devices 10 are connected in parallel to the data bus 52 for a 16-bit microprocessor system. The control terminals of the device 10 ($\overline{\text{ALE}}$, $\overline{\text{CS}}$, $\overline{\text{W}}$, $\overline{\text{RDY}}$, $\overline{\text{RFSH}}$) are coupled via control bus 53 to the microprocessor 50, it being understood that chip select $\overline{\text{CS}}$ is usually generated external to the microprocessor by higher level address bits. For example, the logical address range may be 24-bits, so four bits are used to generate $\overline{\text{CS}}$ for the memory chips. Likewise, the refresh control $\overline{\text{RFSH}}$ may be generated externally.

The processor 50 contains an ALU 55, a register file 56 and an instruction register 57, with control deode circuitry 58 to generate command signals for defining the operation based on an instruction in the instruction register. A program counter 59 contains the address of the next instruction, and this address is sent out by address bus 51 to fetch the next instruction word from memory 10 to be delivered back to the instruction register 57 by data bus 52. The program counter is incremented after each fetch to produce the address of the next instruction, but the incremented address is not used in case of a branch, vector interrupt, or other non-sequential fetch. Based on the assumption that the next instruction is in sequence in perhaps 80% of the cycles, processors have been developed which use pipe-lined prefetch which automatically sends out the incremented program counter address, receives this addressed instruction, and stores it in a queue for loading into IR 57 if needed. Even though many such pipe-lined instructions are not used, it is found that the average execution time is reduced by this method. However, the access time of the memory is nevertheless a limiting factor when the cycle time of the processor is reduced. Accordingly, by also prefetching or pipe-lining in the device 10 as discussed with reference to FIG. 1, the overall average execution speed is further increased. Of course, the device 10 also has advantages in a system wherein the instructions are not pipe-lined in the processor 50 itself.

Figure 6:
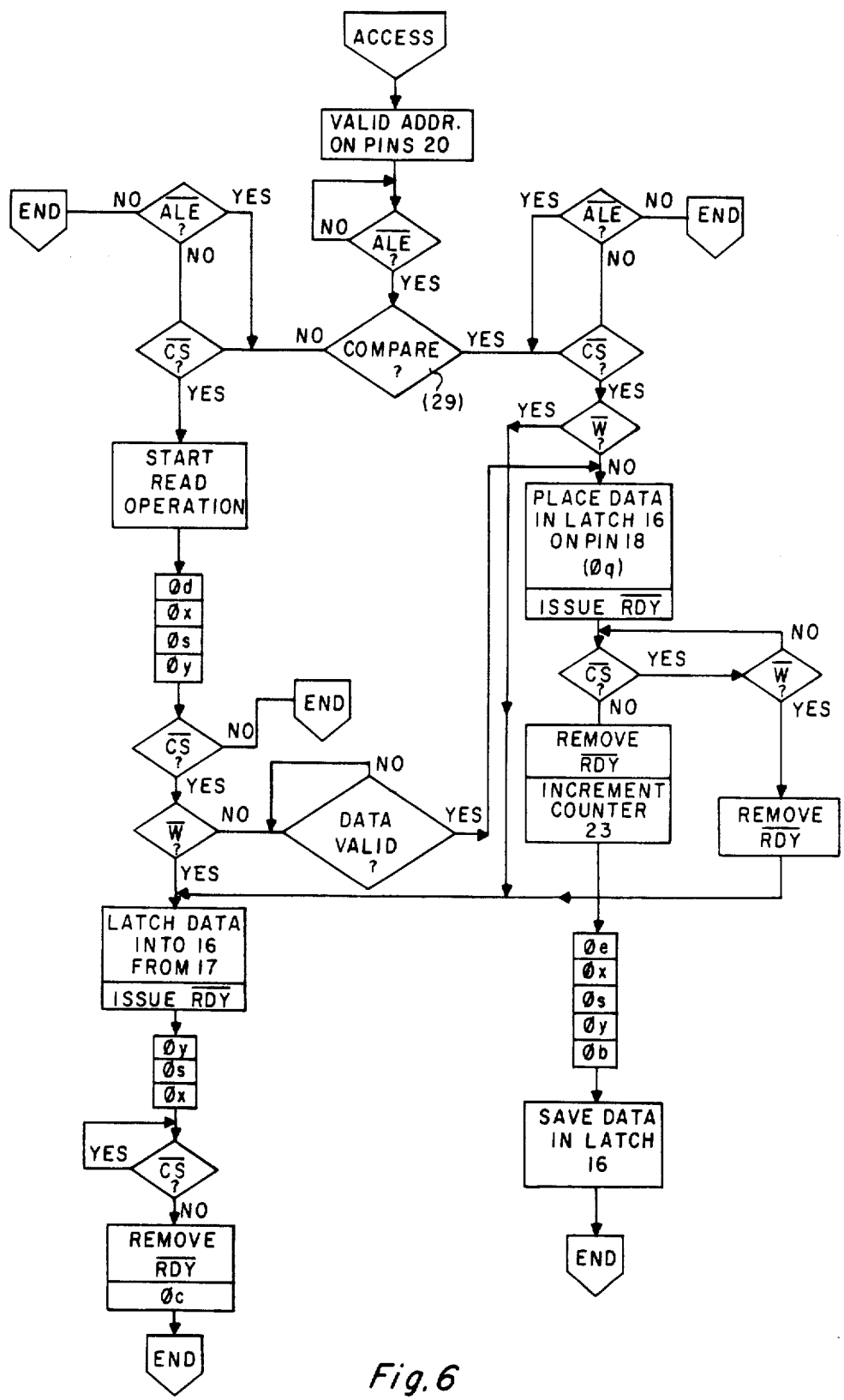
FIG. 6 is a logic flow chart illustrating operation of the device of FIGS. 1-3.

FIG. 6 is a logic flow chart representing one way of constructing the device of FIGS. 1-3. The particular configuration of logic circuitry to implement this operating sequence is selected from standard gates, from a sequencer, a programmable logic array, or other means available to those skilled in the art. The clock delays are generated in a clock generator 34 using delay circuits as in U.S. Pat. No. 4,239,991 issued to Ngai Hong et al, assigned to Texas Instruments. The elements in FIGS. 1-3 which perform the logic functions are labeled with reference numerals from FIGS. 1-3 in parenthesis.

Although described in reference to a dynamic read/write memory, the features of the invention are also particularly useful for ROMs or EPROMs since the pipe-lining concept is more likely to be useful in the program address space than in data address space. However, a dynamic RAM as shown may be used as the main source of program code in which case the RAM is loaded from a boot ROM or is block loaded from disc. Also, it is often the case that the data space for a CPU is located in an address block far removed from the program space, and so data read or write addresses will not activate $\overline{CS}$ for the chips containing the program address space. Thus, data write operations and non-sequential data reads will not disturb the devices 10 containing program memory.

The memory device described herein is shown as a separate integrated circuit, but it is apparent that the memory and its addressing circuitry of FIGS. 11-3 may be located on the same semiconductor chip as the microprocessor 50 of FIG. 5.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A memory drive comprising:
   an array of memory cells;
   accessing means for reading selected data from the array based upon a read address and for storing such data in a data latch;
   a counter with means for incrementing the counter;
   input address terminals for the device;
   a comparator;
   coupling means applying an input address from said terminals to said counter, to said accessing means and to one input of said comparator;
   an address latch having an input connected to receive the incremented contents of the counter an output connected to an input of the comparator;
   and means for activating either said accesssing means or said data latch in response to an output of the comparator.

2. A device according to claim 1 wherein the accessing means includes decoder means and a plurality of sense amplifiers.

3. A device according to claim 1 wherein the array includes rows and columns of dynamic one-transistor memory cells, and the accessing means includes row decoder means and column decoder means.

4. A device according to claim 3 constructed as a single integrated semiconductor unit.

5. A memory device comprising an array of memory cells, an address input to the device for connection to external means, a data output from the device for connection to external bus means, a data latch coupling an output of the array to said data output, control terminals for the device for connection to external control lines for transfer of control signals, and addressing means within the device coupling said address input to the array;
   said addressing means comprising:
      a counter having an input coupled to said address input, with means for incrementing the counter,
      a comparator having first and second inputs and a compare output, the first input being connected to receive the incremented output from the counter,
      an address latch connected to receive the incremented output of the counter, an output of the address latch coupled to the second input of the comparator,
      a control output to one of said control terminals to signal that valid data is presented to said data output,
      and means responsive to said compare output to activate the data latch and the control output.

6. A device according to claim 5 wherein the array of the memory device is an array of dynamic one-transistor memory cells, and the memory device is a single semiconductor integrated circuit.

7. A device according to claim 5 wherein an output of the address latch is coupled to an input of the counter.

8. A device according to claim 5 wherein one of said signals on the control lines is an enable signal from a processor means to the memory device, and said comparator operates only upon receipt of the enable signal.

9. A device according to claim 8 wherein prior to said enable signal the data latch contains data from the array derived from addressing the array with said incremented output from the counter.

10. A processor system comprising:
   processor means having address and data bus means and control lines and functioning to send out addresses on said bus means and to receive data from the bus means under control of signals on said control lines;
   a memory device having an array of memory cells, an address input to the device connected to said bus means, a data output from the device connected to said bus means, a data latch coupling an output of the array to said data output, control terminals for the device connected to said control lines, and addressing means within the device coupling said address to the array;
   said addressing means comprising:
      a counter having an input coupled to said address input, with means for incrementing the counter,
      a comparator having first and second inputs and a compare output, the first input being connected to receive the incremented output from the counter,
      an address latch connected to receive the incremented output of the counter, an output of the address latch coupled to the second input of the comparator,
      a control output to one of said control terminals to signal that valid data is presented to said data output, and means responsive to said compare output to activate the data latch and the control output.

11. A system according to claim 10 wherein the array of the memory device is an array of dynamic one-transistor memory cells, and the memory device is a single semiconductor integrated circuit.

12. A system according to claim 10 wherein an output of the address latch is coupled to an input of the counter.

13. A system according to claim 10 wherein one of said signals on the control lines is an enable signal from the processor means to the memory device, and said comparator operates only upon receipt of the enable signal.

14. A system according to claim 13 wherein prior to said enable signal the data latch contains data from the array derived from said incremented output from the counter.

15. A system according to claim 14 wherein the counter is incremented after said enable signal is no longer present and the data latch is loaded with data from the array based upon addressing the array with the incremented counter output.

* * * * *